(12) United States Patent
Yi

(10) Patent No.: US 8,846,472 B2
(45) Date of Patent: Sep. 30, 2014

(54) METHOD FOR FABRICATING SEMICONDUCTOR DEVICE

(75) Inventor: Hong-Gu Yi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 396 days.

(21) Appl. No.: 13/406,739

(22) Filed: Feb. 28, 2012

(65) Prior Publication Data
US 2012/0220125 A1  Aug. 30, 2012

(30) Foreign Application Priority Data

Feb. 28, 2011  (KR) .................. 10-2011-0017727
Feb. 7, 2012   (KR) .................. 10-2012-0012179

(51) Int. Cl.
| H01L 21/336 | (2006.01) |
| H01L 21/44 | (2006.01) |
| H01L 21/4763 | (2006.01) |
| H01L 21/768 | (2006.01) |
| H01L 27/108 | (2006.01) |

(52) U.S. Cl.
CPC .... *H01L 21/76897* (2013.01); *H01L 27/10855* (2013.01); *H01L 27/10876* (2013.01)
USPC .......... 438/270; 438/607; 438/627; 438/637; 438/675; 365/72

(58) Field of Classification Search
None
See application file for complete search history.

(56) References Cited

U.S. PATENT DOCUMENTS

| 7,920,400 | B2* | 4/2011 | Lee et al. .................. 365/63 |
| 8,202,795 | B2* | 6/2012 | Lee et al. .................. 438/607 |
| 8,604,558 | B2* | 12/2013 | Baek et al. .................. 257/401 |
| 2005/0151206 | A1* | 7/2005 | Schwerin .................. 257/390 |
| 2005/0186740 | A1* | 8/2005 | Kim .................. 438/270 |
| 2008/0266927 | A1* | 10/2008 | Lee et al. .................. 365/63 |
| 2009/0114991 | A1* | 5/2009 | Kim et al. .................. 257/365 |
| 2011/0221010 | A1* | 9/2011 | Baek et al. .................. 257/401 |

* cited by examiner

*Primary Examiner* — Charles Garber
*Assistant Examiner* — Ron Pompey
(74) *Attorney, Agent, or Firm* — IP & T Group LLP

(57) ABSTRACT

A method for fabricating a semiconductor device includes providing a substrate including first landing plugs and second landing plugs that are arrayed on a first line, forming a capping layer over the substrate, forming hole-type first trenches that expose the second landing plugs by selectively etching the capping layer, forming an insulation layer over the substrate including the first trenches, forming line-type second trenches that are stretched on the first line while overlapping with the first trenches by selectively etching the insulation layer, and forming a first conductive layer inside the second trenches.

15 Claims, 13 Drawing Sheets

METHOD FOR FABRICATING SEMICONDUCTOR DEVICE

CROSS-REFERENCE TO RELATED APPLICATIONS

The present application claims priority of Korean Patent Application Nos. 10-2011-0017727 and 10-2012-0012179, filed on Feb. 28, 2011, and Feb. 7, 2012, respectively, which are incorporated herein by reference in their entirety.

BACKGROUND

1. Field

Exemplary embodiments of the present invention relate to a method for fabricating a semiconductor device, and more particularly, to a method for fabricating a semiconductor device including a plurality of contacts.

2. Description of the Related Art

As the semiconductor device fabrication technology has been remarkably enhanced, the integration degree of a semiconductor device is significantly increased to reduce the size of the semiconductor device. As memory devices such as a Dynamic Random Access Memory (DRAM) device achieve high integration degree, cell structures are changing from $8F^2$ to $6F^2$, where F denotes the minimum line width applied to a design rule.

FIG. 1 is a plan view illustrating a conventional semiconductor device having a $6F^2$ cell structure.

Referring to FIG. 1, the conventional semiconductor device includes a plurality of active regions 11, gate lines 12, and bit lines 13. The active regions 11 have a shape of island having a long axis and a short axis and the long axis is disposed to be slanted at an acute angle to a first direction. The gate lines 12 are stretched in a second direction crossing the active regions 11. The bit lines 13 are stretched in a first direction crossing the active regions 11.

The gate lines 12 are disposed to cross in such a manner that two gate lines 12 cross one active region 11. Each active region 11 is divided into three parts by the two gate lines 12: two parts disposed in the exterior of the two gate lines 12, which are referred to as edge parts hereinafter, and a central part between the two gate lines 12. Each of the two edge parts may be a region to be coupled with a storage node (not shown) and the central part may be a region to be coupled with a bit line 13.

As shown, the active regions 11 are arrayed in the first direction in such a manner that the central parts are disposed on a line stretched B-B' in the first direction. Also, the active regions 11 are arrayed in the second direction in such a manner that one edge part, the other edge part, and the central part are alternately disposed on a line A-A' stretched in the second direction.

The bit lines 13 overlap with the central parts that are arrayed in the first direction, and are coupled with the central parts of the active regions 11 directly or with a conductive material interposed between them. Also, storage nodes (not shown) are coupled with the edge parts of the active regions 11 directly or with a conductive material interposed between them.

However, diverse concerns may appear in the process of fabricating such a type of the semiconductor device. One of them may be occurring in the process of forming bit line contacts and storage node contacts that are respectively coupled with the central parts and the edge parts of the active regions 11. When contact holes are formed to form storage node contacts or bit line contacts according to the conventional technology, holes may be formed to have a narrow width due to technical limitation in exposure and development processes. Therefore, it may be difficult to perform a subsequent process, for example, a process of forming storage nodes over the storage node contacts. Also, misalignment may occur in a formation of the contacts for edge parts or formation of the contacts for central parts. In particular, since the edge parts and the central parts may be disposed close to each other in the conventional semiconductor device, when misalignment occurs, for example, a storage node contact may be un-desirably coupled to the central part of the active region 11. As a result, the production yield of the semiconductor device may be seriously deteriorated.

To address the above concerns, a line type opening forming technique has been introduced. The line type opening forming technique includes forming a line type opening having a relatively wide width then that of contact holes, filling the line-type opening with a conductive material, and isolating the conductive material in a subsequent process. However, since the edge parts and the central parts of the active regions 11 are arranged on the A-A' line of FIG. 1 and the edge parts may be disposed closely to the central parts of the active regions 11 in the conventional semiconductor device, not only the portion to be exposed by the line-type opening, for example, the edge part, but also the other parts, for example, undesirable parts, i.e., the central part, may be exposed.

SUMMARY

An exemplary embodiment of the present invention is directed to a method for fabricating a semiconductor device that may mitigate procedural difficulty and improve production yield.

In accordance with an exemplary embodiment of the present invention, a method for fabricating a semiconductor device providing a substrate including first landing plugs and second landing plugs that are arrayed on a first line, forming a capping layer over the substrate, forming hole-type first trenches that expose the second landing plugs by selectively etching the capping layer, forming an insulation layer over the substrate including the first trenches, forming line-type second trenches that are stretched on the first line while overlapping with the first trenches by selectively etching the insulation layer, and forming a first conductive layer inside the second trenches.

DETAILED DESCRIPTION

Figure 1:
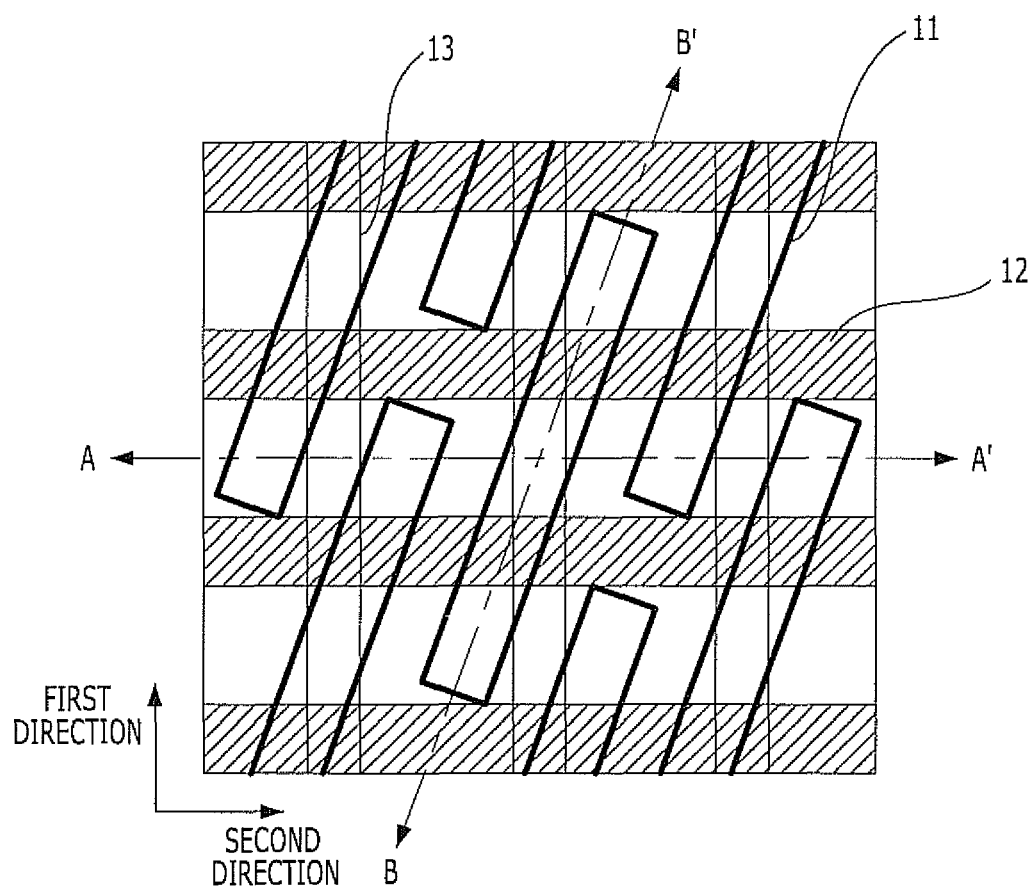
FIG. 1 is a plan view illustrating a conventional semiconductor device having a $6F^2$ cell structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 7C illustrate a method for fabricating a semiconductor device in accordance with an exemplary embodiment of the present invention. FIGS. 2A, 3A, 4A, 5A, 6A and 7A are plan views, and FIGS. 2B, 3B, 4B, 5B, 6B and 7B are cross-sectional views taken along a line A-A' of FIGS. 2A, 3A, 4A, 5A, 6A and 7A, respectively. FIGS. 2C, 3C, 4C, 5C, 6C and 7C are cross-sectional views taken along a line B-B' of FIGS. 2A, 3A, 4A, 5A, 6A and 7A, respectively. The plan views are illustrated with a focus on the part that may be needed to understand the exemplary embodiment of the present invention.

Figure 2A:
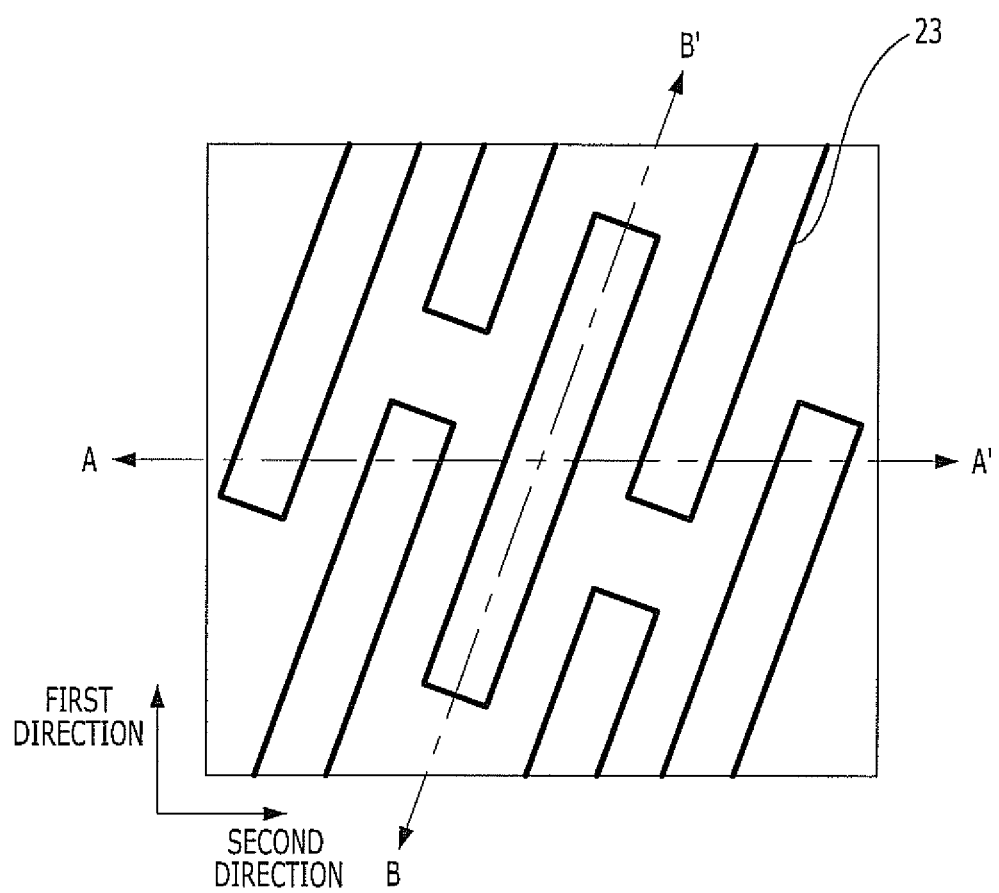
FIGS. 2A to 7C illustrate a method for fabricating a semiconductor device in accordance with an exemplary embodiment of the present invention.
Figure 2B:
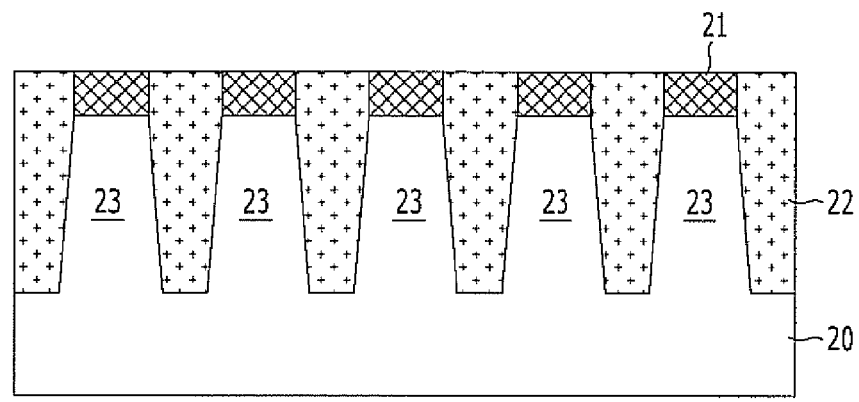
Figure 2C:
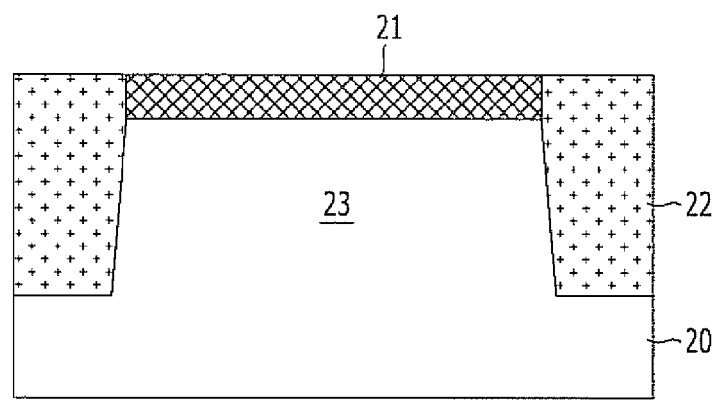

Referring to FIGS. 2A to 2C, a hard mask layer 21 is formed over a semiconductor substrate 20, and then isolation trenches and active regions 23 defined by the isolation trenches are formed by etching the hard mask layer 21 and the semiconductor substrate 20 to a predetermined depth using a mask pattern (not shown) that exposes isolation regions. In this embodiment of the present invention, the hard mask layer 21 may be a conductive layer, such as a polysilicon layer doped with an impurity, and the hard mask layer 21 may be used as landing plugs in a subsequent process. However, the scope of the present invention is not limited to it, and the hard mask layer 21 may be an insulation layer, such as an oxide layer and a nitride layer in another exemplary embodiment of the present invention. In this case, the hard mask layer 21 may be substituted with a conductive material in a subsequent process.

Subsequently, an isolation layer 22 is formed by filling the isolation trenches with an insulation layer. The isolation layer 22 may include an oxide layer.

The active regions 23 has a shape of island having a long axis and a short axis on a plane view of FIG. 2A, and the long axes of the active regions 23 are arrayed to be slanted at an acute angle to a first direction. Each of the active regions 23 includes a central part, a first edge, and a second edge that are defined in a subsequent process of forming gate lines. The central parts, the first edge parts, and the second edge parts of the active regions 23 are alternately disposed on a line (refer to A-A') stretched in a second direction, and the central parts are arrayed in the first direction to be disposed on a line that is stretched in the first direction.

Figure 3A:
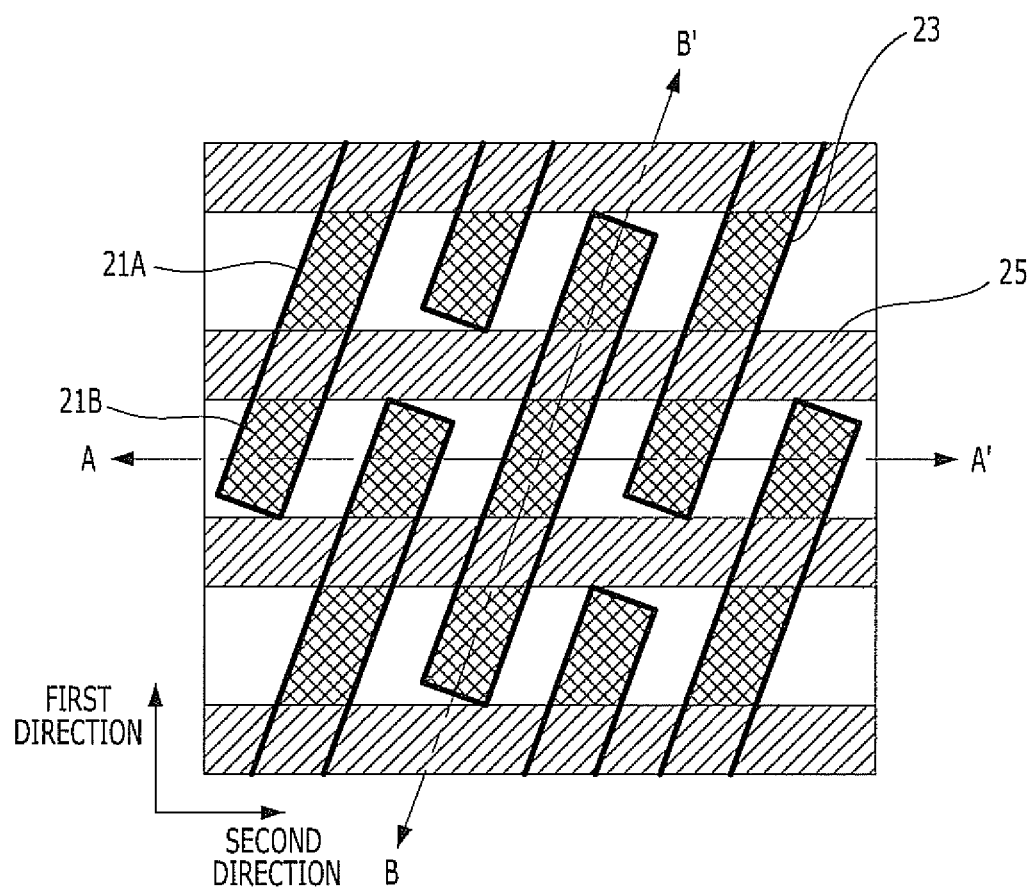
Figure 3B:
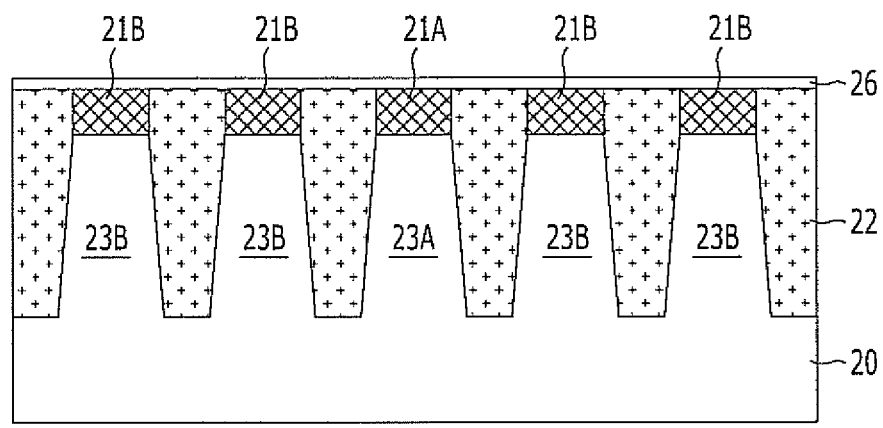
Figure 3C:
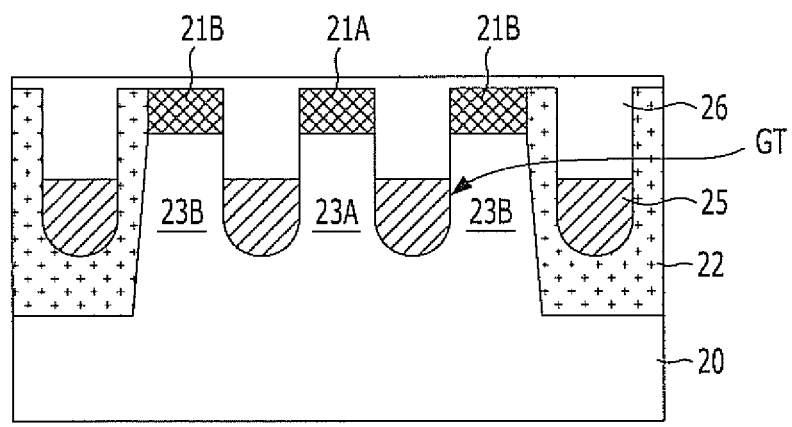

Referring to FIGS. 3A to 3C, gate line-forming trenches GT stretched in the second direction are formed by forming a mask pattern (not shown) that exposes the regions (refer to reference numeral '25') where gate lines are to be formed on the hard mask layer 21 and the isolation layer 22, etching the hard mask layer 21 as shown in FIGS. 2B and 2C by using the mask pattern as an etch barrier, and etching the exposed isolation layer 22 and/or the active regions 23 to a predetermined depth.

As shown in FIG. 3C, the gate line-forming trenches GT are disposed in such a manner that each active region 23 is crossed by two gate line-forming trenches GT. As a result, each of the active regions 23 is etched in this process and is divided into edge parts 23B and a central part 23A. The edge parts 23b are disposed in the exterior of the two gate line-forming trenches GT and the central part 23A is disposed between the two gate line-forming trenches GT. Also, the hard mask layer 21 is etched in this process and is divided into a first portion 21B disposed on the edge parts 23B and a second portion 21A disposed on the central part 23A.

As described above, when the hard mask layer 21 is formed by, for example, a conductive layer, the first portion 21B disposed over the edge parts 23B of the etched hard mask layer 21 is used as second landing plugs, and the second portion 21A disposed over the central parts 23A are used as first landing plugs. The second landing plugs 21B may be coupled with storage nodes, and the first landing plugs 21A may be coupled with bit lines. Meanwhile, when the hard mask layer 21 is formed by, for example, an insulation layer, the first landing plugs 21A and the second landing plugs 21B may be formed by a landing plug forming process. The landing plug forming process includes, for example, forming the gate line-forming trenches GT, filling the gate line-forming trenches GT with a dielectric material, removing the etched hard mask layer 21, and filling the space, from which the etched hard mask layer 21 is removed, with a conductive material.

Subsequently, a gate insulation layer (not shown) is formed on the surface of the gate line-forming trenches GT by performing a gate oxidation process, and then gate lines 25 are formed by filling a portion of each gate line-forming trench GT with a conductive layer. The upper surface of the gate lines 25 may be lower than the surface of the central part 23A and the edge parts 23B of the active regions 23. Such a structure may be used to insulate the first landing plugs 21A and the second landing plugs 21B from the gate lines 25.

Subsequently, a sealing layer 26 is formed to fill the gate line-forming trenches GT where the gate lines 25 are formed. The sealing layer 26 prevents the gate lines 25 from being exposed. The sealing layer 26 may include a nitride layer. In this embodiment of the present invention, the sealing layer 26 is formed not only over the gate lines 25 but also over the resultant substrate including the gate lines 25. However, the scope of the present invention is not limited to it and the sealing layer 26 may be formed only in the gate line-forming trenches GT.

Figure 4A:
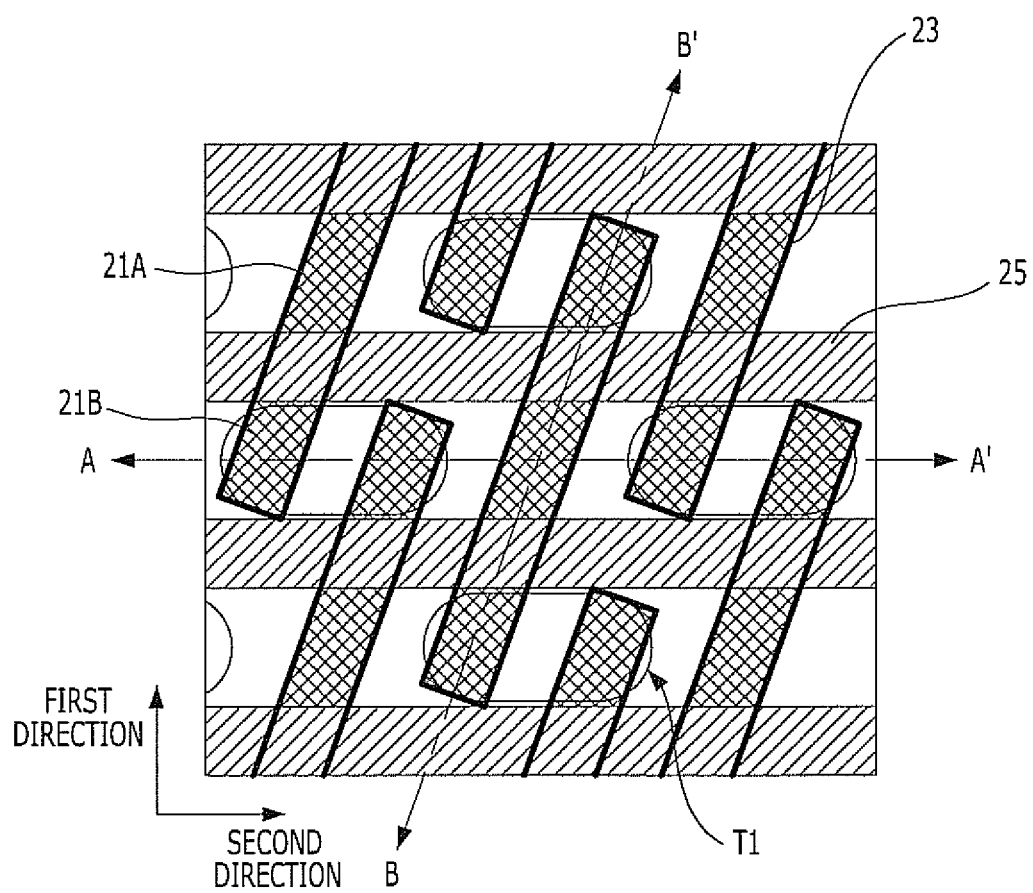
Figure 4B:
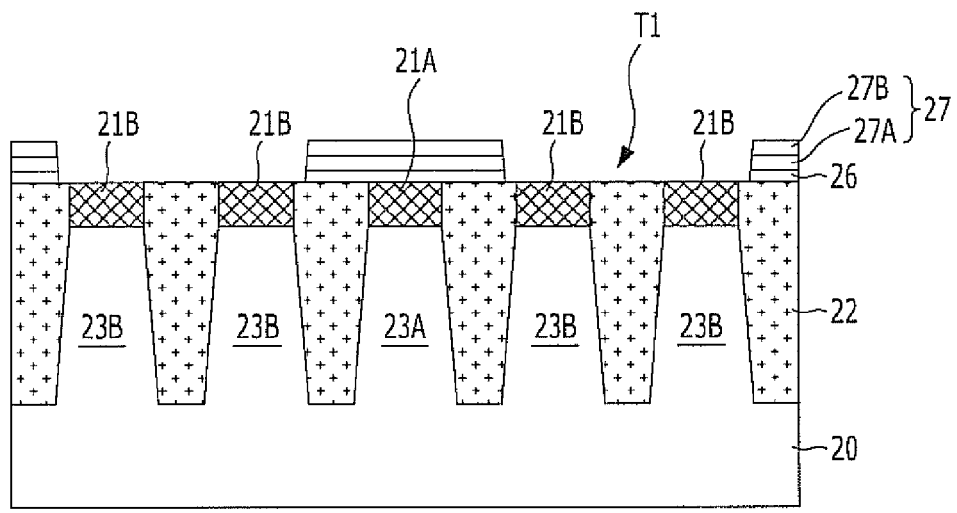
Figure 4C:
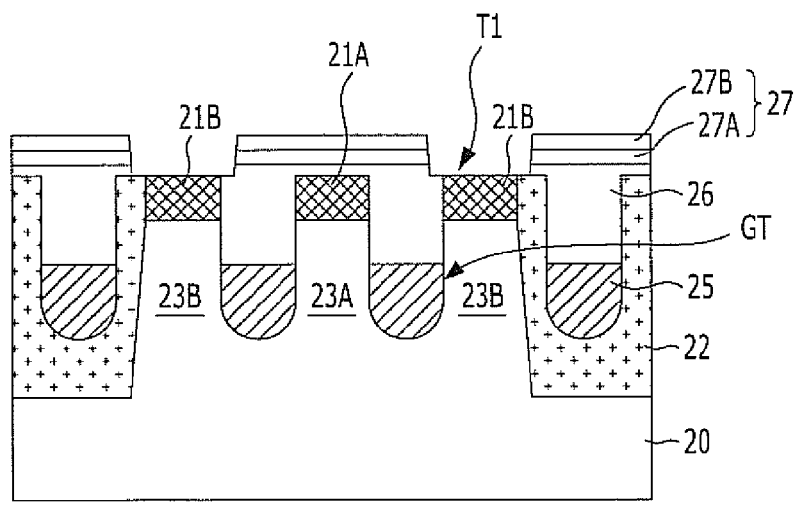

Referring to FIGS. 4A to 4C, a capping layer 27 is formed over the resultant substrate of FIGS. 3A to 3C. Then, hole-type first trenches T1 for forming storage node contacts are formed by selectively etching the sealing layer 26 and the capping layer 27, wherein the hole-type trenches T1 simultaneously expose two second landing plugs 21B adjacent to each other in the second direction and the region between the two adjacent second landing plugs 21B. If the sealing layer 26 is formed only in the gate line-forming trenches GT, the first trenches T1 may be formed by selectively etching the capping layer 27. Although the first trenches T1 has a hole-type, one first trench T1 exposes more than twice as wide region as one second landing plugs 21B do. Therefore, the first trenches T1 may have a relatively wide width. For this reason, the mask and etching processes for forming the first trenches T1 may be more easily performed.

The hole-type first trenches T1 are formed in order not to expose the first landing plugs 21A disposed on the same line (refer to the A-A' line) in the second direction in a subsequent process for forming line-type trenches for forming storage node contacts. To this end, the loss of the capping layer 27 during the subsequent processes has to be minimized.

To minimize the loss of the capping layer 27, the capping layer 27 in this embodiment of the present invention may have a stacked structure where a first capping layer 27A which is, for example, an oxide layer and a second capping layer 27B which is, for example, a nitride layer are stacked. The effects of the capping layer 27 formed in the stacked structure will be described hereinafter, when the capping layer 27 is described.

Although not illustrated in the drawing, a cleaning process is performed on the resultant substrate including the first trenches T1. The cleaning process may be a wet process using a buffered oxide echant (BOE). When the uppermost portion of the capping layer 27 is the second capping layer 27B which is a nitride layer as shown in the exemplary embodiment of the present embodiment, the loss of the capping layer 27 may be minimized despite the cleaning process.

Figure 5A:
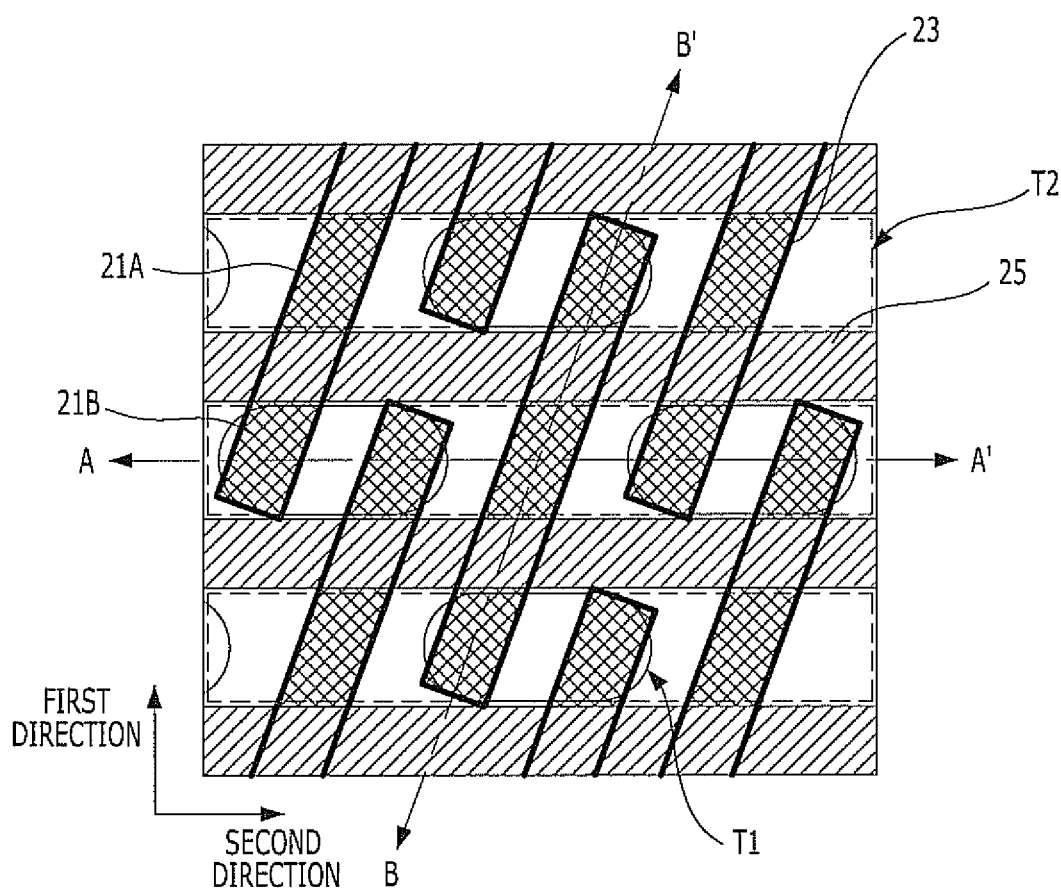
Figure 5B:
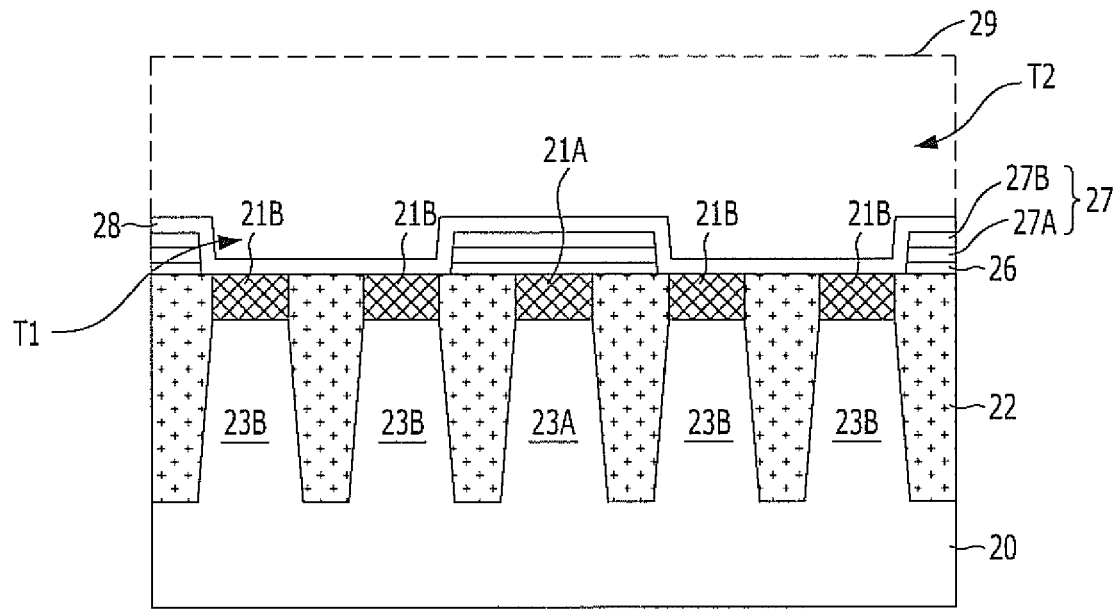
Figure 5C:
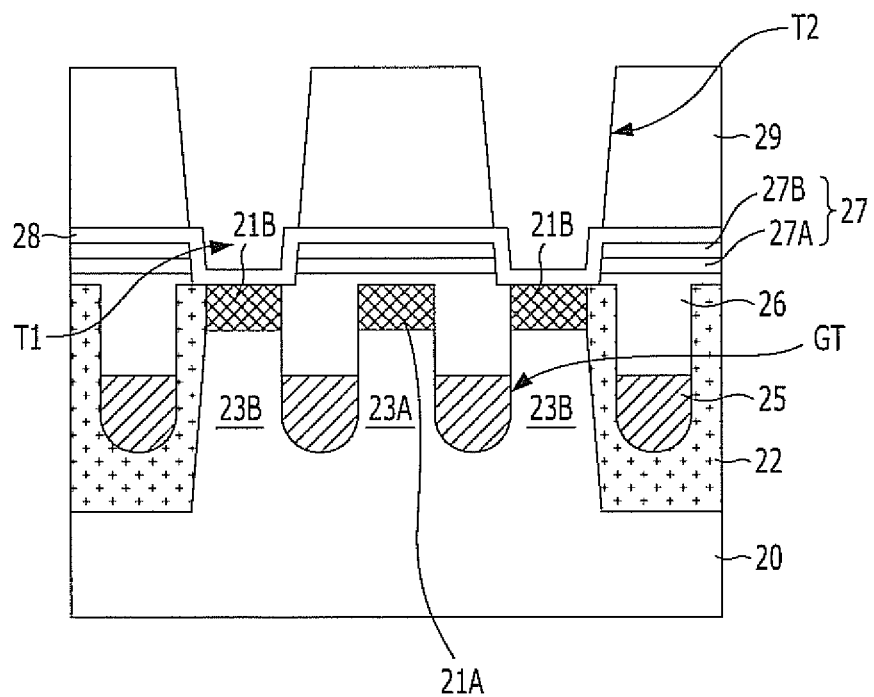

Referring to FIGS. 5A to 5C, an etch stop layer 28 is formed along the surface profile of the substrate structure of FIGS. 4A to 4C, and an inter-layer dielectric layer 29 is formed over the etch stop layer 28. The inter-layer dielectric layer 29 may be an oxide layer, and the etch stop layer 28 may be a layer having a different etch rate from the etch rate of the inter-layer dielectric layer 29. For example, the etch stop layer 28 may be a nitride layer.

Subsequently, as shown in FIG. 5C, line-type second trenches T2 for forming storage node contacts that are stretched in the second direction while overlapping with the first trenches T1 are formed by selectively etching the inter-layer dielectric layer 29. The second trenches T2 are formed in a line-type to expand the width of the upper portion of the storage node contacts and facilitate the subsequent process. The etch process for forming the second trenches T2 may be formed based on an etch recipe where the etch rate of an oxide layer with respect to a nitride layer is great.

Meanwhile, FIG. 5B shows a cross section of a portion where the second trenches T2 are formed. Since the inter-layer dielectric layer 29 is removed, it is not illustrated in FIG. 5B. The portion, where the inter-layer dielectric layer 29 is removed, is marked by using a dotted line.

Figure 6A:
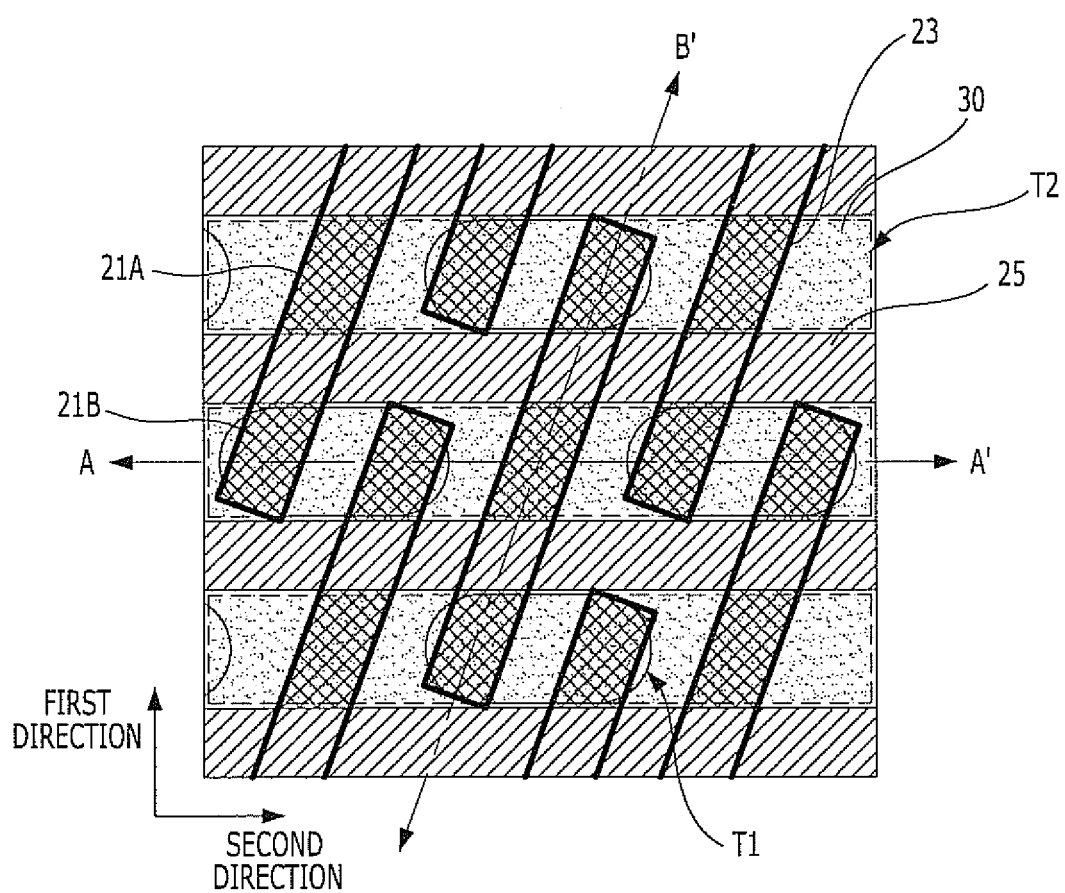
Figure 6B:
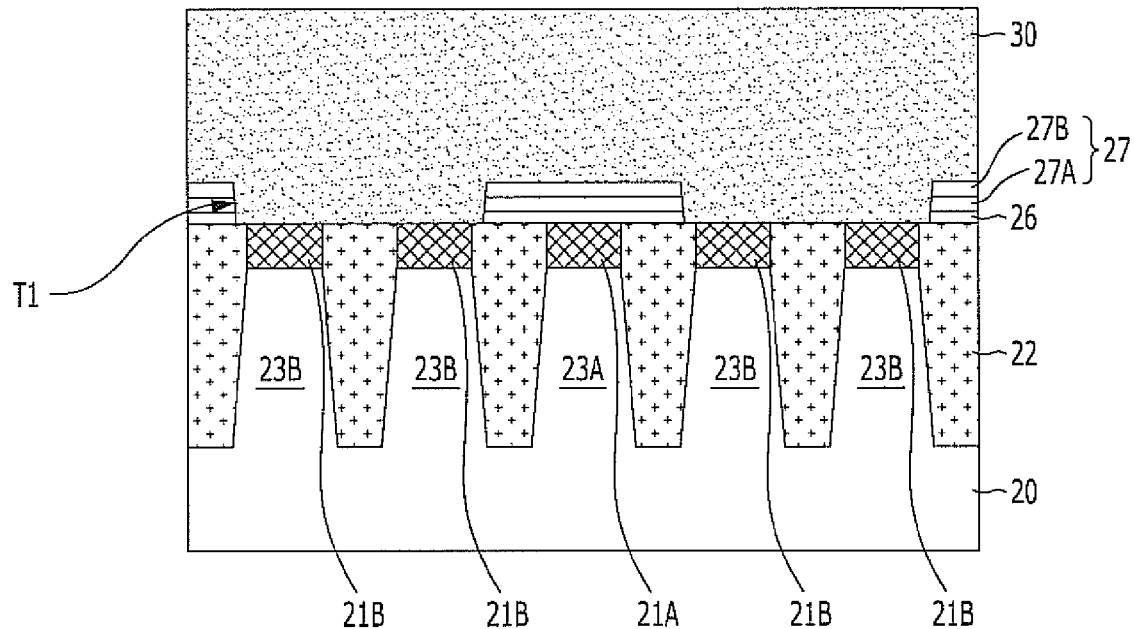
Figure 6C:
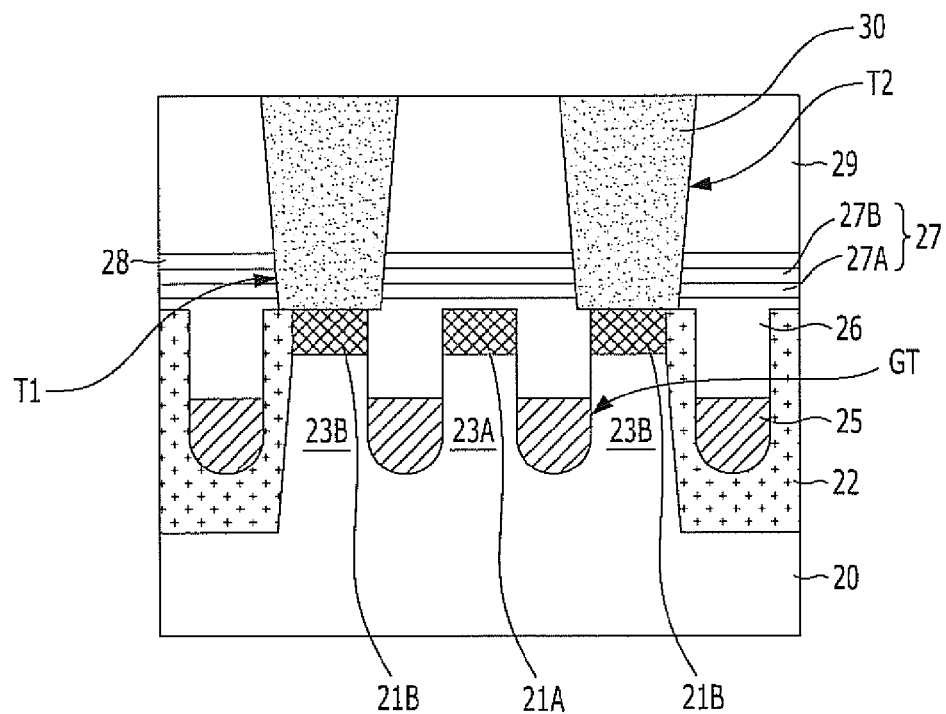

Referring to FIGS. 6A to 6C, the etch stop layer 28 exposed through the second trenches T2 is etched and removed.

As a result, the second landing plugs 21B are exposed in a region overlapping with the first trenches T1 among the region where the second trenches T2 are formed. The lower structure of the capping layer 27, specifically, the first landing plugs 21A, are not exposed because the capping layer 27 exists thereon. As described, when the uppermost portion of the capping layer 27 is the second capping layer 27B which is, for example, a nitride layer, the second capping layer 27B may not be removed in the cleaning process described with reference to FIGS. 4A to 4C. When the etch stop layer 28 is removed in this state, the second capping layer 27B may remain although the second capping layer 27B is formed of the same nitride layer as the etch stop layer 28. This is, the etch stop layer 28 only exists as a thin nitride layer on the regions formed at the second trenches T2 and overlapping with the first trenches T1. Both etch stop layer 28 and second capping layer 27B exist together as a thick nitride layer in the other regions. Therefore, when the etch process is ceased at a moment when the etch stop layer 28 is removed in the regions where the first trenches T1 are formed, a portion of the second capping layer 27B in the thick nitride layer may remain.

Subsequently, a storage node contact-forming conductive layer 30 is formed by filling the second trenches T2 and the first trenches T1 with a conductive material, such as polysilicon doped with an impurity after the etch stop layer 28 is removed. Since the second trenches T2 are formed in a line type, the width of the upper portion of the storage node contact-forming conductive layer 30 may be wide. However, since the storage node contact-forming conductive layer 30 simultaneously contacts two second landing plugs 21B, the storage node contact-forming conductive layer 30 has to be divided in order for storage node contacts to contact the respective second landing plugs 21B. Therefore, the subsequent process for the above is performed.

Figure 7A:
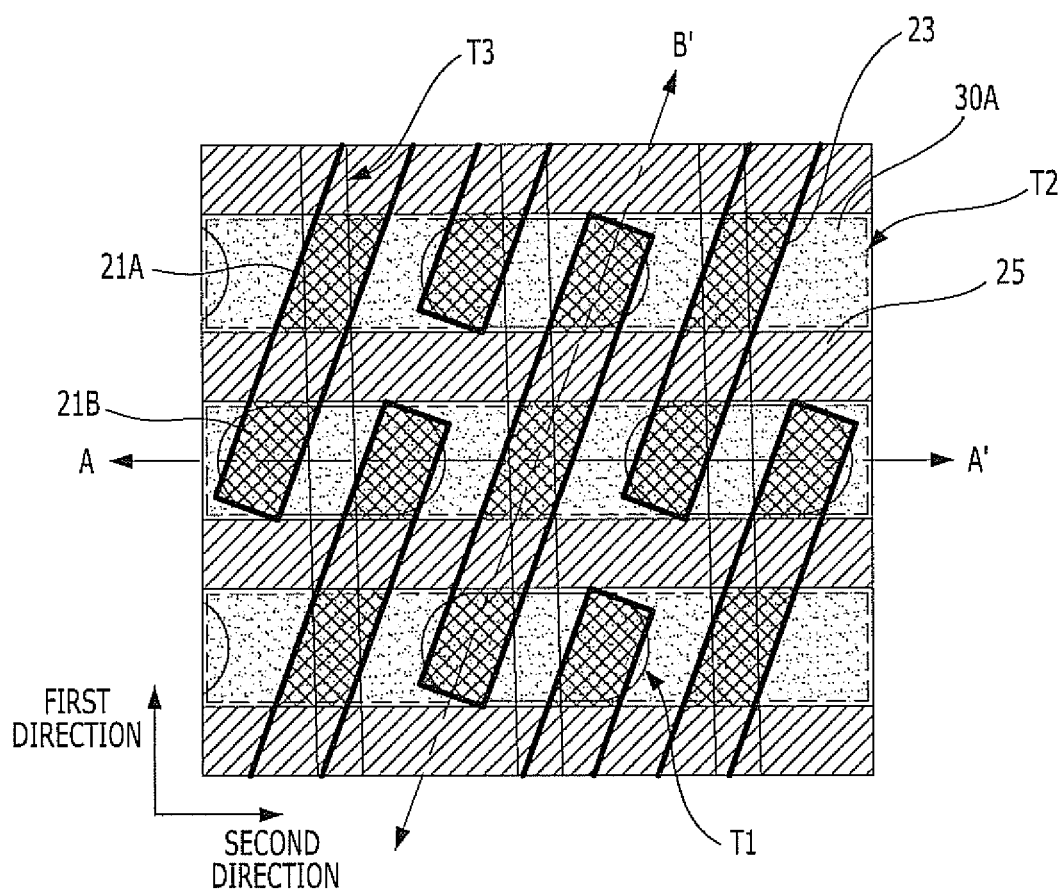
Figure 7B:
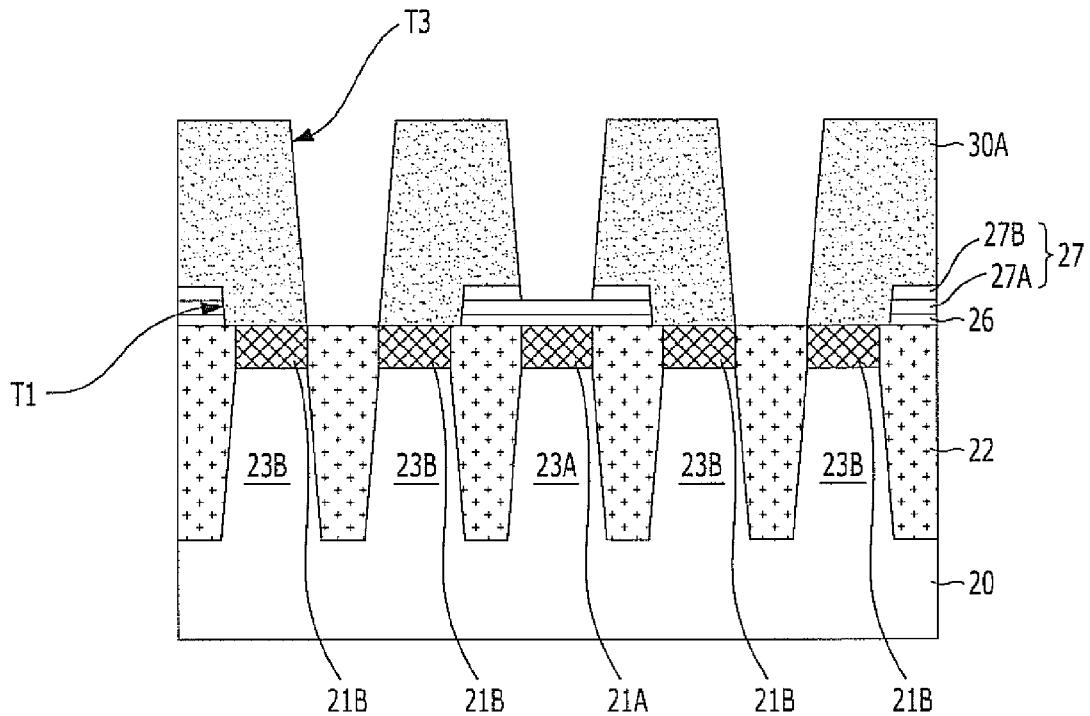
Figure 7C:
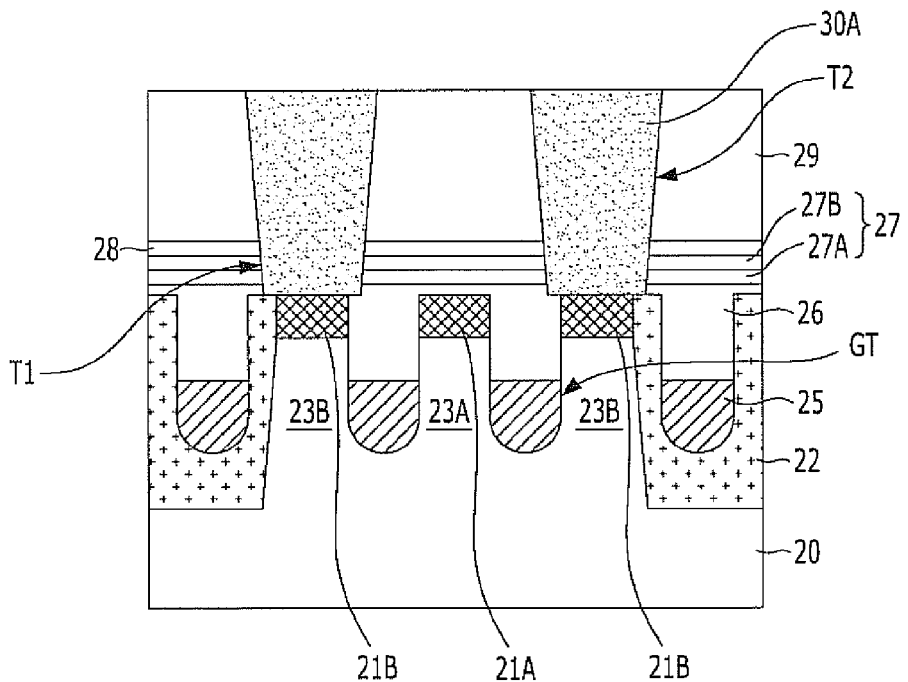

Referring to FIGS. 7A to 7C, in order for storage node to contact the second landing plugs 21B, respectively, a mask pattern (not shown) for exposing the regions, where bit lines are to be formed, is formed over the storage node contact-forming conductive layer 30 and the inter-layer dielectric layer 29. Third trenches T3 for forming bit lines or bit line contacts are then formed by using the mask pattern as an etch barrier and etching the storage node contact-forming conductive layer 30 and the inter-layer dielectric layer 29. The third trenches T3 have a shape of lines stretched in the first direction and expose the first landing plugs 21A arrayed in the first direction. Also, since the third trenches T3 pass between the second landing plugs 21B, the storage node contact-forming conductive layer 30 is divided by the third trenches T3 between the neighboring second landing plugs 21B. The divided storage node contact-forming conductive layer 30 is referred to as storage node contacts 30A, hereinafter.

The etch process for forming the third trenches T3 may be divided into a process for etching the storage node contact-forming conductive layer 30 and a process for etching the inter-layer dielectric layer 29. The inter-layer dielectric layer 29 may be etched using the second capping layer 27B as an etch stop layer. To this end, an etch recipe having an etch selectivity with respect to a nitride layer may be used. Also, the storage node contact-forming conductive layer 30 may be etched until the isolation layer 22 is exposed for complete formation of the storage node contacts 30A. When the first capping layer 27A is an oxide layer, the first capping layer 27A may be used as an etch stop layer. To this end, the storage node contact-forming conductive layer 30 may be etched based on an etch recipe having an etch selectivity with respect to an oxide layer. When the first capping layer 27A is used as an etch stop layer, it may be possible to protect the first landing plugs 21A from being exposed and damaged in the process of forming the third trenches T3.

Although not illustrated in the drawing, bit lines or bit line contacts may be formed by forming insulation spacers for isolating the storage node contacts 30A from the bit lines or the bit line contacts that are to be formed subsequently on the sidewalls of the third trenches T3, removing the first capping layer 27A and/or the sealing layer 26 that are/is exposed through the third trenches T3 to expose the first capping layer 27A, and filling a conductive material.

The method for fabricating a semiconductor device in accordance with an exemplary embodiment of the present invention described above may increase the width of the upper portion of storage node contacts because the trenches for forming the storage node contacts may be formed in a line type by using a capping layer. For this reason, the subsequent processes may be more easily performed. Furthermore, since the capping layer is formed in a double-layer structure where an oxide layer and a nitride layer are sequentially stacked, it may be possible to suppress the loss of the capping layer during the subsequent processes and to minimize the damage on the first landing plugs.

The method for fabricating a semiconductor device in accordance with an exemplary embodiment of the present invention may decrease procedural difficulty and improve production yield.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

providing a substrate including first landing plugs and second landing plugs that are arrayed on a first line;

forming a capping layer over the substrate;

forming hole-type first trenches that expose the second landing plugs by selectively etching the capping layer;

forming an insulation layer over the substrate including the first trenches;

forming line-type second trenches that are stretched on the first line while overlapping with the first trenches by selectively etching the insulation layer; and forming a first conductive layer inside the second trenches.

2. The method of claim 1, wherein the capping layer comprises a stacked structure which includes a first capping layer and a second capping layer stacked, wherein the first capping layer includes an oxide layer and the second capping layer includes a nitride layer.

3. The method of claim 2, further comprising
forming a cleaning process, after the forming of the hole-type first trenches.

4. The method of claim 2, wherein the forming of the insulation layer comprises:
sequentially forming an etch stop layer and an inter-layer dielectric layer, wherein the etch stop layer includes a nitride layer and the inter-layer dielectric layer includes an oxide layer.

5. The method of claim 4, wherein the forming of the line-type second trenches comprises:
etching the inter-layer dielectric layer until the etch stop layer is exposed; and
removing the etch stop layer that is exposed as the inter-layer dielectric layer is etched,
wherein the removing of the etch stop layer is performed in a manner that at least a portion of the second capping layer remains.

6. The method of claim 1, wherein one first landing plug and two second landing plugs are alternately arranged on the first line, and
each of the first trenches exposes the two second landing plugs and a region between the two second landing plugs.

7. The method of claim 6, further comprising:
after the forming of the first conductive layer, forming line-type third trenches that are stretched on a second line crossing the first line while dividing the first conductive layer between the two second landing plugs by selectively etching the first conductive layer and the insulation layer.

8. The method of claim 7, wherein the third trenches overlap with the first landing plugs arranged on the second line.

9. The method of claim 8, wherein the capping layer has a stacked structure where a first capping layer and a second capping layer stacked, wherein the first capping layer includes an oxide layer and the second capping layer includes a nitride layer.

10. The method of claim 9, wherein the insulation layer includes an oxide layer.

11. The method of claim 10, wherein the forming of the line-type third trenches comprises:
etching the insulation layer by using the second capping layer as an etch stop layer; and
etching the first conductive layer by using the first capping layer as an etch stop layer.

12. The method of claim 8, further comprising:
after the forming of the line-type third trenches, exposing the first landing plugs by removing the capping layer that is exposed through the third trenches; and
forming a second conductive layer inside the third trenches.

13. The method of claim 1, wherein the first landing plugs are to be coupled with bit lines, and the second landing plugs are to be coupled with storage nodes.

14. A method for fabricating a semiconductor device, comprising:
providing a substrate including first landing plugs and second landing plugs that are arrayed on a first line;
forming a capping layer over the substrate;
forming hole-type first trenches, each exposing at least two adjacent second landing plugs, by selectively etching the capping layer;
forming an insulation layer over the substrate including the first trenches;
forming line-type second trenches that are stretched on the first line while overlapping with the first trenches by selectively etching the insulation layer; and
forming a first conductive layer inside the second trenches.

15. The method of claim 14, wherein one first landing plug and two second landing plugs are alternately arranged on the first line, and each of the first trenches exposes the two second landing plugs and a region between the two second landing plugs.

* * * * *